United States Patent
Fuji et al.

(10) Patent No.: US 11,427,413 B2
(45) Date of Patent: Aug. 30, 2022

(54) FLOTATION CONVEYANCE APPARATUS AND LASER PROCESSING APPARATUS

(71) Applicant: JSW AKTINA SYSTEM CO., LTD., Yokohama (JP)

(72) Inventors: Takahiro Fuji, Tokyo (JP); Yoshihiro Yamaguchi, Tokyo (JP)

(73) Assignee: JSW AKTINA SYSTEM CO., LTD., Yokohama (JP)

( * ) Notice: Subject to any disclaimer, the term of this patent is extended or adjusted under 35 U.S.C. 154(b) by 0 days.

(21) Appl. No.: 17/172,806

(22) Filed: Feb. 10, 2021

(65) Prior Publication Data

US 2021/0261359 A1    Aug. 26, 2021

(30) Foreign Application Priority Data

Feb. 26, 2020   (JP) ............................. JP2020-030106

(51) Int. Cl.
*B65G 51/03*     (2006.01)
*B65G 49/06*     (2006.01)

(52) U.S. Cl.
CPC ............. *B65G 51/03* (2013.01); *B65G 49/06* (2013.01)

(58) Field of Classification Search
CPC .. B65G 51/03; B65G 2207/06; Y10S 414/101
USPC ..................................... 406/87, 88; 414/676
See application file for complete search history.

(56) References Cited

U.S. PATENT DOCUMENTS

| | | | | |
|---|---|---|---|---|
| 4,021,078 A | * | 5/1977 | Hutar ..................... | B65G 53/58 406/194 |
| 4,299,518 A | * | 11/1981 | Whelan ............... | H01L 21/6779 406/62 |
| 4,738,748 A | * | 4/1988 | Kisa .................. | H01L 21/32136 438/727 |
| 4,874,273 A | * | 10/1989 | Tokisue ................. | B65G 51/03 406/88 |
| 4,978,253 A | * | 12/1990 | Lazzari .................. | B65G 51/03 406/86 |
| 5,113,992 A | * | 5/1992 | Sadamori .......... | H01L 21/67778 198/347.1 |
| 5,299,890 A | * | 4/1994 | Spatafora ............... | B65G 51/03 406/88 |
| 5,611,648 A | * | 3/1997 | Lenhart .................. | B65G 51/03 406/88 |
| 5,821,175 A | * | 10/1998 | Engelsberg ............. | G03F 7/704 438/795 |

(Continued)

FOREIGN PATENT DOCUMENTS

JP       2019-192681 A     10/2019

*Primary Examiner* — Joseph A Dillon, Jr.
(74) *Attorney, Agent, or Firm* — Sughrue Mion, PLLC

(57) ABSTRACT

A flotation conveyance apparatus according to an embodiment is for conveying a substrate while floating the substrate by ejecting a gas to a lower surface of the substrate. The flotation conveyance apparatus includes a plurality of ejecting ports configured to eject the gas to the substrate, a downstream flow-path configured to supply the gas to the plurality of ejecting ports, a upstream flow-path configured to supply the gas to the downstream flow-path, and a gas supply port configured to supply the gas to the downstream flow-path. A cross-sectional area of the upstream flow-path is configured to be larger than a cross-sectional area of the downstream flow-path.

18 Claims, 10 Drawing Sheets

(56) References Cited

U.S. PATENT DOCUMENTS

| | | | | |
|---|---|---|---|---|
| 7,326,025 B2 | * | 2/2008 | Viluan | H01L 21/67288 198/346.1 |
| 7,435,039 B2 | * | 10/2008 | Ludwig | B65G 47/24 406/88 |
| 7,464,929 B2 | * | 12/2008 | Hachmann | B41F 21/00 101/230 |
| 7,604,439 B2 | * | 10/2009 | Yassour | F16C 29/025 406/88 |
| 7,648,897 B2 | * | 1/2010 | Yamazaki | H01L 27/1292 438/585 |
| 7,690,870 B2 | * | 4/2010 | Lisec | B65G 49/063 406/92 |
| 7,908,995 B2 | * | 3/2011 | Inamasu | B65G 49/067 118/300 |
| 8,292,549 B2 | * | 10/2012 | Iida | B65G 49/065 406/88 |
| 8,905,680 B2 | * | 12/2014 | Lee | H01L 21/6838 406/87 |
| 9,022,699 B2 | * | 5/2015 | Richman | B65H 5/22 406/88 |
| 9,505,245 B2 | * | 11/2016 | Lowrance | B41J 3/407 |
| 9,550,633 B2 | * | 1/2017 | Tsunoda | B65G 51/03 |
| 9,640,495 B2 | * | 5/2017 | Olson | H01L 24/19 |
| 9,776,809 B1 | * | 10/2017 | Naor | B65G 47/848 |
| 10,446,426 B2 | * | 10/2019 | Fuji | H01L 21/67784 |
| 10,600,652 B2 | * | 3/2020 | Olson | H01L 24/05 |
| 10,738,382 B2 | * | 8/2020 | Granneman | C23C 16/45551 |
| 10,837,107 B2 | * | 11/2020 | Granneman | B65G 51/02 |
| 10,950,474 B2 | * | 3/2021 | Imamura | H01L 21/6776 |
| 2005/0015170 A1 | * | 1/2005 | Adin | F16C 29/025 700/110 |
| 2006/0189170 A1 | * | 8/2006 | Yamazaki | C23C 16/4557 438/795 |
| 2006/0219605 A1 | * | 10/2006 | Devitt | C03B 23/0235 209/37 |
| 2007/0181735 A1 | * | 8/2007 | Fedorov | B65G 51/03 242/541.7 |
| 2010/0104380 A1 | * | 4/2010 | Toda | H01L 21/67784 406/12 |
| 2010/0290844 A1 | * | 11/2010 | Voelk | H01L 21/67784 406/92 |
| 2013/0098289 A1 | * | 4/2013 | He | C30B 25/14 117/98 |
| 2014/0037847 A1 | * | 2/2014 | Vermeer | C23C 16/458 427/255.28 |
| 2016/0264360 A1 | * | 9/2016 | Chen | H01L 21/67706 |
| 2016/0268153 A1 | * | 9/2016 | Wada | B65G 49/065 |
| 2019/0088507 A1 | * | 3/2019 | Suzuki | F16C 32/0618 |
| 2019/0193200 A1 | * | 6/2019 | Fuji | B23K 37/0408 |
| 2020/0006096 A1 | * | 1/2020 | Imamura | H01L 21/02675 |
| 2021/0159100 A1 | * | 5/2021 | Imamura | B23K 26/10 |
| 2021/0252635 A1 | * | 8/2021 | Fuji | B23K 26/50 |
| 2021/0261358 A1 | * | 8/2021 | Fuji | B65G 49/06 |
| 2021/0362273 A1 | * | 11/2021 | Suzuki | H01L 21/268 |

* cited by examiner

FLOTATION CONVEYANCE APPARATUS AND LASER PROCESSING APPARATUS

INCORPORATION BY REFERENCE

This application is based upon and claims the benefit of priority from Japanese patent application No. 2020-030106, filed on Feb. 26, 2020, the disclosure of which is incorporated herein in its entirety by reference.

BACKGROUND

The present disclosure relates to a flotation conveyance apparatus and a laser processing apparatus. In particular, the present disclosure relates to a flotation conveyance apparatus and a laser processing apparatus that conveys a substrate while floating the substrate.

In a process of manufacturing a liquid crystal display panel, an organic EL panel, and so on, a flotation conveyance apparatus for conveying a substrate while floating the substrate is widely used, because the substrate to be used is large. Japanese Unexamined Patent Application Publication No. 2019-192681 discloses a technique relating to a flotation conveyance apparatus for floating and conveying a substrate by blowing a gas to the substrate.

SUMMARY

There is a problem that a flotation amount of a substrate varies in a flotation conveyance apparatus which conveys a substrate while floating the substrate. In particular, a laser processing apparatus for irradiating a substrate with a laser beam is desired to improve the flotation accuracy of the substrate, because the variation in the flotation amounts of the substrate greatly influences the quality of a film and the like on the laser-processed substrate.

Other problems and novel features will become apparent from the description in the present specification and the accompanying drawings.

An example aspect is a flotation conveyance apparatus for conveying a substrate while floating the substrate by ejecting a gas to a lower surface of the substrate. The flotation conveyance apparatus includes: a plurality of ejecting ports configured to eject the gas to the substrate; a first flow-path configured to supply the gas to the plurality of ejecting ports; a second flow-path configured to supply the gas to the first flow-path; and a gas supply port configured to supply the gas to the second flow-path. A cross-sectional area of the second flow-path is configured to be larger than a cross-sectional area of the first flow-path.

A laser processing apparatus according to the example aspect includes the above flotation conveyance apparatus and a laser generation unit configured to generate a laser beam to be applied to the substrate.

According to the above aspect, it is possible to provide a flotation conveyance apparatus which can improve flotation accuracy of a substrate.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

First Embodiment

Figure 1:
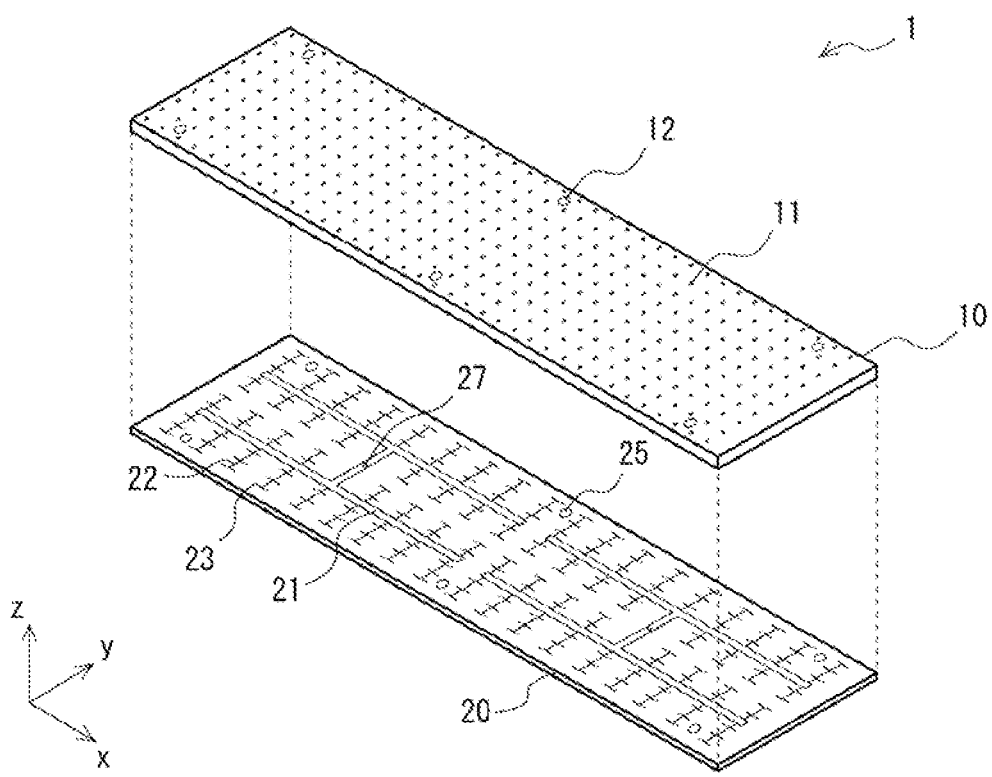
FIG. 1 is an exploded perspective view for explaining a flotation conveyance apparatus according to a first embodiment.
Figure 2:
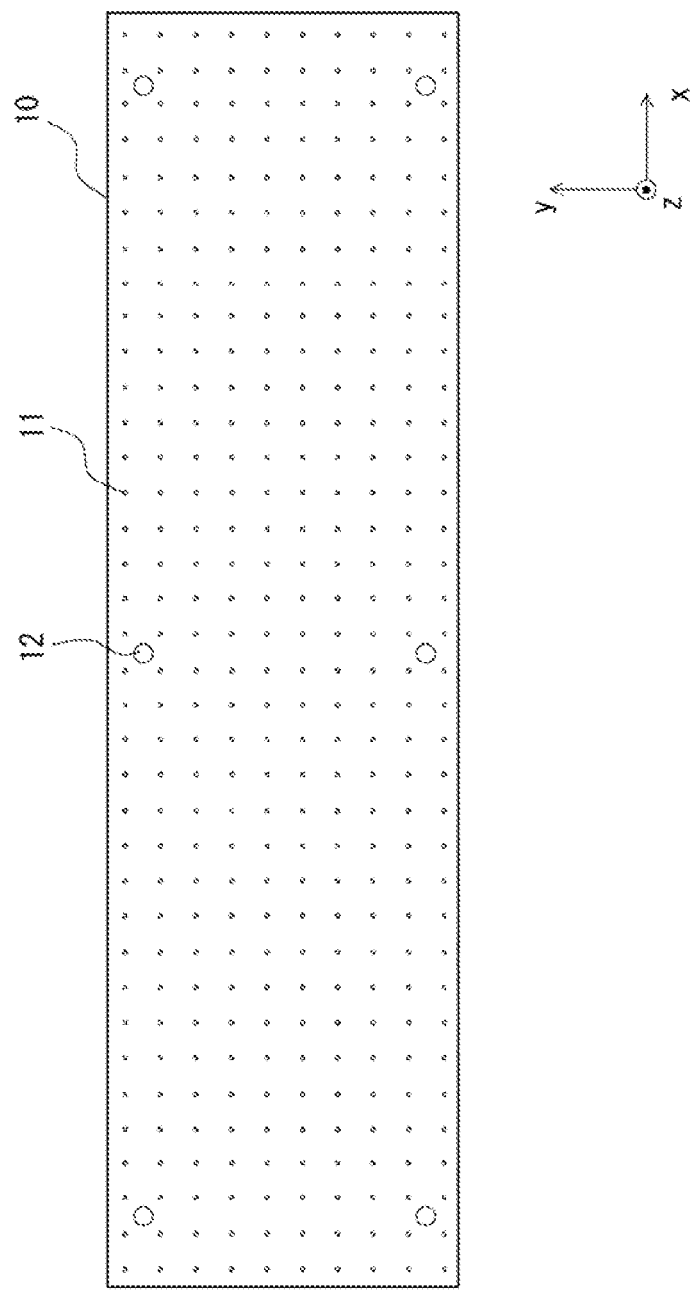
FIG. 2 is a top view for explaining the flotation conveyance apparatus according to the first embodiment.
Figure 3:
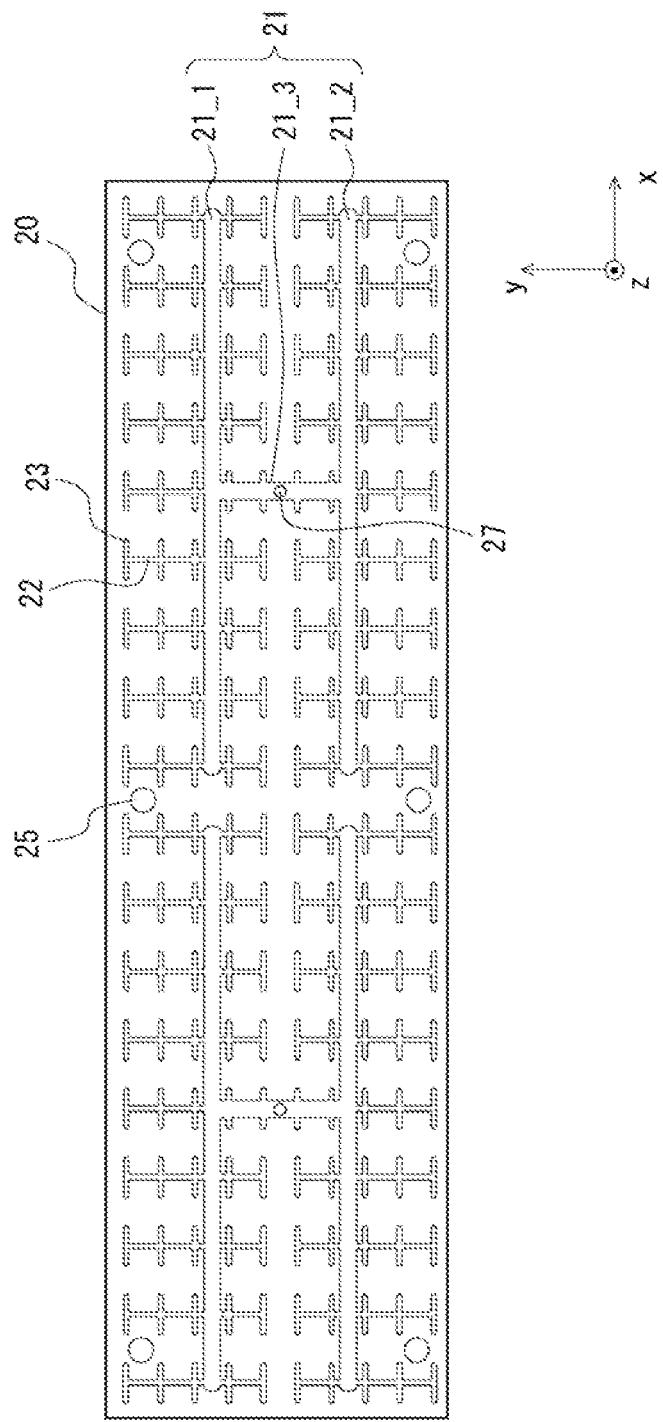
FIG. 3 is a top view of a lower plate of the flotation conveyance apparatus according to the first embodiment.
Figure 4:
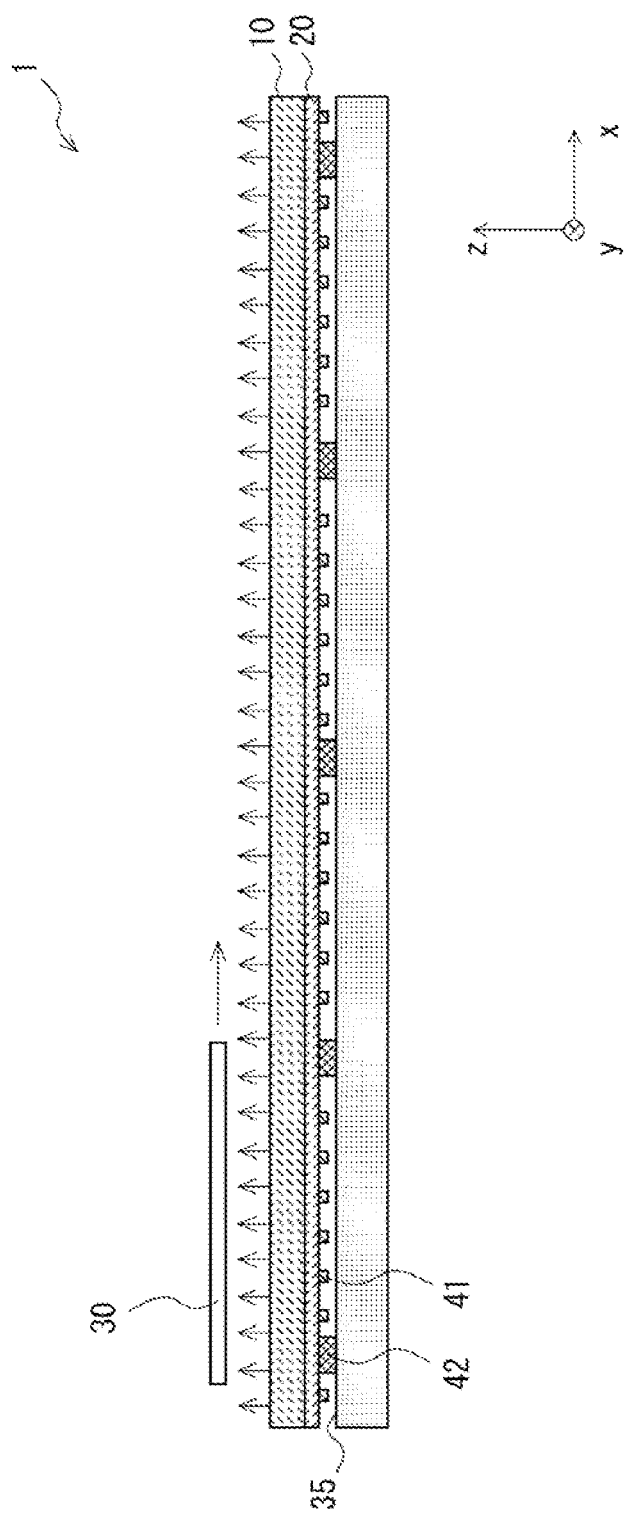
FIG. 4 is a cross-sectional view of the flotation conveyance apparatus according to the first embodiment.

A first embodiment will be described below with reference to the drawings. FIG. 1 is an exploded perspective view for explaining a flotation conveyance apparatus according to the first embodiment. FIG. 2 is a top view for explaining the flotation conveyance apparatus according to the first embodiment. FIG. 3 is a top view of a lower plate of the flotation conveyance apparatus according to the first embodiment. FIG. 4 is a cross-sectional view of the flotation conveyance apparatus according to the first embodiment. As shown in FIG. 4, a flotation conveyance apparatus 1 according to this embodiment is an apparatus for conveying a substrate 30 in a conveyance direction (a positive direction of an x-axis) while floating the substrate 30 by ejecting a gas to a lower surface of the substrate 30.

As shown in FIG. 1, the flotation conveyance apparatus 1 according to this embodiment includes an upper plate 10 and a lower plate 20. The upper plate 10 is disposed on an upper side of the flotation conveyance apparatus 1 (a positive side of a z-axis direction). The lower plate 20 is disposed under the upper plate 10 (a negative side of a z-axis direction). For example, the upper plate 10 and the lower plate 20 may be made of a metallic material such as an aluminum alloy which is optionally plated.

As shown in FIGS. 1 and 2, a plurality of ejecting ports 11 for ejecting a gas upward are provided in a surface of the upper plate 10. Each ejecting port 11 can be formed, for example, by making a hole extending in the z-axis direction in the upper plate 10. As will be described later, each of the ejecting ports 11 may be formed by inserting a columnar member (a columnar member with a side part cut out in a vertical direction) into a hole part provided in the upper plate 10 (see a second embodiment).

As shown in FIG. 4, the flotation conveyance apparatus 1 according to this embodiment ejects a gas from the plurality of ejecting ports 11 toward the positive side of the z-axis direction, and causes the ejected gas to collide with a lower surface of the substrate 30 to thereby float the substrate 30. By moving the substrate 30 in the conveyance direction (the positive direction of the x-axis) using conveyance means (not shown), the substrate 30 can be conveyed in the conveyance direction while the substrate 30 is being floated.

In the example shown in FIG. 2, the plurality of ejecting ports 11 are regularly arranged at predetermined intervals in the x-axis direction and the y-axis direction. However, in this embodiment, the arrangement of the plurality of ejecting ports 11 is not limited to the arrangement shown in FIG. 2, and may be any arrangement. A plurality of penetrating holes 12 into which leveling bolts 42 (see FIG. 4) are to be inserted are formed near an outer periphery of the upper plate 10.

As shown in FIG. 1, the lower plate 20 is disposed under the upper plate 10. As shown in FIGS. 1 and 3, a surface of the lower plate 20 facing the upper plate 10 (i.e., the positive side of the z-axis direction) is provided with a plurality of flow-paths 21 and 22 for supplying the gas to the plurality of ejecting ports 11 of the upper plate 10.

Specifically, as shown in FIG. 3, the upstream flow-paths 21 and the downstream flow-paths 22 are provided on the surface of the lower plate 20. In the present specification, the flow-paths 21 and 22 on the gas supply port 27 side are defined as the upstream flow-paths while the flow-paths 21 and 22 on the ejecting port 11 side are defined as the downstream flow-paths.

The upstream flow-paths 21 supply the gas supplied from the gas supply ports 27 to each of the positive side of the y-axis direction and the negative side of the y-axis direction of the lower plate 20. That is, the upstream flow-paths 21 include flow-paths 21_1 provided on the positive side of the y-axis direction of the lower plate 20, flow-paths 21_2 provided on the negative side of the y-axis direction of the lower plate 20, and flow-paths 21_3 for supplying the gas supplied from the gas supply ports 27 to each of the flow-paths 21_1 and the flow-paths 21_2. In the example shown in FIG. 3, the upstream flow-paths 21 (the flow-paths 21_1 to 21_3) are in the shape of H, and the gas supply ports 27 are provided at positions where the upstream flow-paths 21 become point-symmetrical with respect to the gas supply ports 27.

The downstream flow-paths 22 supply the gas supplied from the gas supply ports 27 through the upstream flow-paths 21 to the plurality of ejecting ports 11 provided in the upper plate 10. The end parts of the downstream flow-paths 22 on the upstream side are connected to the upstream flow-paths 21. The downstream flow-paths 22 on the downstream side are branched, and end parts 23 of the branched flow-paths are connected to the ejecting ports 11 (see FIG. 2), respectively. Specifically, each downstream flow-path 22 includes a flow-path (trunk) extending in the y-axis direction from a connection point with the upstream flow-path 21, and a plurality of flow-paths (branches) extending in the x-axis direction from the flow-path (trunk). The end parts 23 of the plurality of flow-paths (branches) extending in the x-axis direction are connected to the ejecting ports 11, respectively (see FIG. 2).

In the example shown in FIG. 3, the upstream flow-paths 21 (the flow-paths 21_1 and 21_2) are provided so as to extend in the x-axis direction, and each of the end parts of the plurality of downstream flow-paths 22 on the upstream side is connected to the upstream flow-paths 21 (the flow-paths 21_1 and 21_2) in such a way that the end parts of the plurality of downstream flow-paths 22 on the upstream side are substantially equally spaced from each other.

Specifically, the plurality of downstream flow-paths 22 are provided on the positive side of the y-axis direction of the flow-paths 21_1 of the upstream flow-paths 21, and the end parts of the downstream flow-paths 22 on the upstream side are connected to the flow-paths 21_1 in such a way that the end parts of the downstream flow-paths 22 on the upstream side are substantially equally spaced from each other. Likewise, the plurality of downstream flow-paths 22 are provided on the negative side of the y-axis direction of the flow-paths 21_1 of the upstream flow-paths 21, and the end parts of the downstream flow-paths 22 on the upstream side are connected to the flow-paths 21_1 in such a way that the end parts of the downstream flow-paths 22 on the upstream side are substantially equally spaced from each other. Note that the plurality of downstream flow-paths 22 connected to the flow-paths 21_2 of the upstream flow-path 21 have the same structure as the structure described above. Here, the term "substantially equally spaced" includes a case where the spacing is slightly shifted from the equal spacing in addition to the case where the spacing is equal.

In this embodiment, the cross-sectional area of the upstream flow-path 21 is configured to be larger than that of the downstream flow-path 22. That is, since the upstream flow-paths 21 function as flow-paths for supplying the gas supplied from the gas supply ports 27 to each of the downstream flow-paths 22, the amount of the gas passing through the upstream flow-paths 21 is larger than the amount of the gas passing through the downstream flow-paths 22. Thus, by making the cross-sectional area of the upstream flow-paths 21 larger than that of the downstream flow-paths 22, the resistance of the flow-paths from the gas supply ports 27 to the ejecting ports 11 can be reduced. This reduces the pressure loss of the gas in the upstream flow-paths 21 and the downstream flow-paths 22 and enables the gas maintained at a pressure about the same as the pressure of the gas supplied to the gas supply ports 27 to be supplied to the ejecting ports 11.

That is, in this embodiment, since the cross-sectional area of the upstream flow-path 21 is larger than that of the downstream flow-path 22, the gas supplied from the gas supply ports 27 can be uniformly distributed to the upstream flow-paths 21. Thus, after the gas is made to uniformly spread to the upstream flow-paths 21, the gas can be made to flow to the downstream flow-paths 22. In this manner, reduction in the pressure of the gas (compressed gas) in the downstream flow-paths 22 can be prevented. This also effectively prevents the variations in the flow rate of the gas ejected from the ejecting ports 11, so that the flotation accuracy of the substrate 30 can be improved.

For example, in this embodiment, the cross-sectional area of the upstream flow-path 21 and the cross-sectional area of the downstream flow-path 22 can be adjusted by the width and depth of each flow-path. For example, the width of the upstream flow-path 21 may be made wider than the width of the downstream flow-path 22. The depth of the upstream flow-path 21 may be made deeper than that of the downstream flow-path 22. The width of the upstream flow-path 21 may be made wider than the width of the downstream flow-path 22, and the depth of the upstream flow-path 21 may be made deeper than the depth of the downstream flow-path 22.

In this embodiment, the cross-sectional area of the upstream flow-path 21 may be configured to be larger than that of the gas supply port 27. With such a configuration, the gas can be uniformly distributed to the upstream flow-paths 21. Note that the gas is supplied to the upstream flow-paths 21 by connecting pipes to the gas supply ports 27, and the cross-sectional area of each of the gas supply ports 27 at this time is, for example, the cross-sectional area of a tap hole to which a joint connected to the gas supply port 27 is to be attached.

In this embodiment, the cross-sectional area of the downstream flow-path 22 may be configured to be substantially the same as that of the ejecting port 11. With such a configuration, it is possible to more effectively effectively prevent the variations in the flow rate of the gas ejected from the ejecting ports 11. Here, the term "substantially the same" includes a case where the cross-sectional area of the downstream flow-path 22 is slightly different from that of the ejecting port 11 in addition to a case where the cross-sectional area of the downstream flow-path 22 is the same as that of the ejecting port 11.

The arrangement of the upstream flow-paths 21 and the downstream flow-paths 22 shown in FIG. 3 is an example, and in this embodiment, the arrangement of the upstream flow-paths 21 and the downstream flow-paths 22 may be freely determined. That is, the arrangement of the upstream flow-paths 21 and the downstream flow-paths 22 may be any arrangement as long as the upstream flow-paths 21 and the downstream flow-paths 22 are configured to supply the gas from the gas supply ports 27 to the ejecting ports 11 through the upstream flow-paths 21 and the downstream flow-paths 22.

Penetrating holes 25 into which the leveling bolts 42 (see FIG. 4) are to be inserted are formed near the outer periphery of the lower plate 20. The positions of the penetrating holes 25 in the lower plate 20 correspond to the positions of the penetrating holes 12 in the upper plate 10.

In this embodiment, the upper plate 10 and the lower plate 20 are fastened to each other using fastening bolts. For example, the upper plate 10 and the lower plate 20 may be fastened to each other using a plurality of fastening bolts 41 (FIG. 4) inserted from the lower plate 20 side.

As described above, the flotation conveyance apparatus 1 according to this embodiment supplies the gas supplied from the gas supply ports 27 to the ejecting ports 11 through the upstream flow-paths 21 and the downstream flow-paths 22. Thus, as shown in FIG. 4, the gas can be ejected from the plurality of ejecting ports 11 to the lower surface of the substrate 30 to thereby float the substrate 30. Although the substrate 30 is typically a glass substrate, the substrate 30 conveyed by the flotation conveyance apparatus 1 is not limited to a glass substrate.

Further, the flotation conveyance apparatus 1 according to this embodiment is composed of the two plates of the upper plate 10 and the lower plate 20. With such a configuration, it is possible to effectively prevent generation of a gap between contact surfaces of the upper plate 10 and the lower plate 20, and effectively prevent leakage of the gas from the contact surfaces of the upper plate 10 and the lower plate 20. It is thus possible to effectively prevent variations in the flow rate of the gas ejected from the plurality of ejecting ports 11, and thus the flotation accuracy of the substrate 30 can be effectively enhanced.

Although an example in which the flow-paths 21 and 22 are formed on the lower plate has been described above, in the flotation conveyance apparatus 1 according to this embodiment, the flow-paths 21 and 22 may be formed on at least one of the upper plate 10 and the lower plate 20. Specifically, as described above, the flow-paths 21 and 22 may be formed only on the lower plate 20. Alternatively, the flow-paths 21 and 22 may be formed only on the upper plate 10. Further alternatively, the flow-paths 21 and 22 may be formed on both the upper plate 10 and the lower plate 20.

In this embodiment, as shown in FIG. 4, the thickness of the lower plate 20 may be configured to be thinner than the thickness of the upper plate 10. When the thickness of the lower plate 20 is made thinner than the thickness of the upper plate 10, if the upper plate 10 and the lower plate 20 are fastened to each other by the plurality of fastening bolts 41 (see FIG. 4), the lower plate 20, which is thinner than the upper plate 10, bends along the surface (the contact surface) of the upper plate 10 at the contact surfaces of the upper plate 10 and the lower plate 20, thereby closing the gap in the contact surfaces of the upper plate 10 and the lower plate 20. It is thus possible to more reliably prevent the leakage of the gas from the contact surfaces of the upper plate 10 and the lower plate 20.

In the flotation conveyance apparatus 1 according to this embodiment, since it is necessary to increase the surface accuracy of the surface of the flotation conveyance apparatus 1 facing the substrate 30 (i.e., the upper surface of the upper plate 10), it is necessary to increase the thickness of the upper plate 10. Therefore, in this embodiment, it is preferable to increase the thickness of the upper plate 10 and decrease the thickness of the lower plate 20.

As shown in FIG. 4, the plurality of leveling bolts 42 projecting downward from the lower surface of the flotation conveyance apparatus 1 are provided in the flotation conveyance apparatus 1 according to this embodiment. As shown in FIG. 4, in this embodiment, the flotation conveyance apparatus 1 is installed on an installation surface 35 by bringing the plurality of leveling bolts 42 into contact with the installation surface 35.

The leveling bolts 42 are provided in the penetrating holes 12 and 25, which are formed in the upper plate 10 and the lower plate 20 of the flotation conveyance apparatus 1, and are configured to be displaced inside the penetrating holes 12 and 25 in the up-down direction (z-axis direction), respectively. For example, the leveling bolts 42 are configured to be screwed with at least one of the upper plate 10 and the lower plate 20. By rotating the leveling bolts 42, the amount of projection of the leveling bolts 42 from the lower surface of the flotation conveyance apparatus 1 can be changed.

The gas supply ports 27 (see FIG. 3) for supplying the gas to the flow-paths 21 and 22, which are provided on the lower plate 20, are provided in the lower surface of the lower plate 20. As shown in FIG. 4, when the leveling bolts 42 are brought into contact with the installation surface 35 to install the flotation conveyance apparatus 1, a space is formed between the lower surface of the flotation conveyance apparatus 1 (the lower plate 20) and the installation surface 35. Pipes (not shown) may be disposed in this space, and the gas may be supplied to the gas supply ports 27 through these pipes.

For example, the surface accuracy of the surfaces (contact surfaces) of the leveling bolts 42 that are brought into contact with the installation surface 35 may be made higher than the surface accuracy of the lower surface of the lower plate 20. That is, when the flotation conveyance apparatus 1 is installed, if the positions that are brought into contact with the installation surface 35 is limited to the contact surfaces of the leveling bolts 42 (lower surface), the installation accuracy of the flotation conveyance apparatus 1 depends on the surface accuracy of the contact surfaces (lower surface) of the leveling bolts 42. Thus, by enhancing the surface accuracy of the contact surfaces of the leveling bolts 42 (lower surface), the installation accuracy of the flotation conveyance apparatus 1 can be enhanced.

Figure 5:
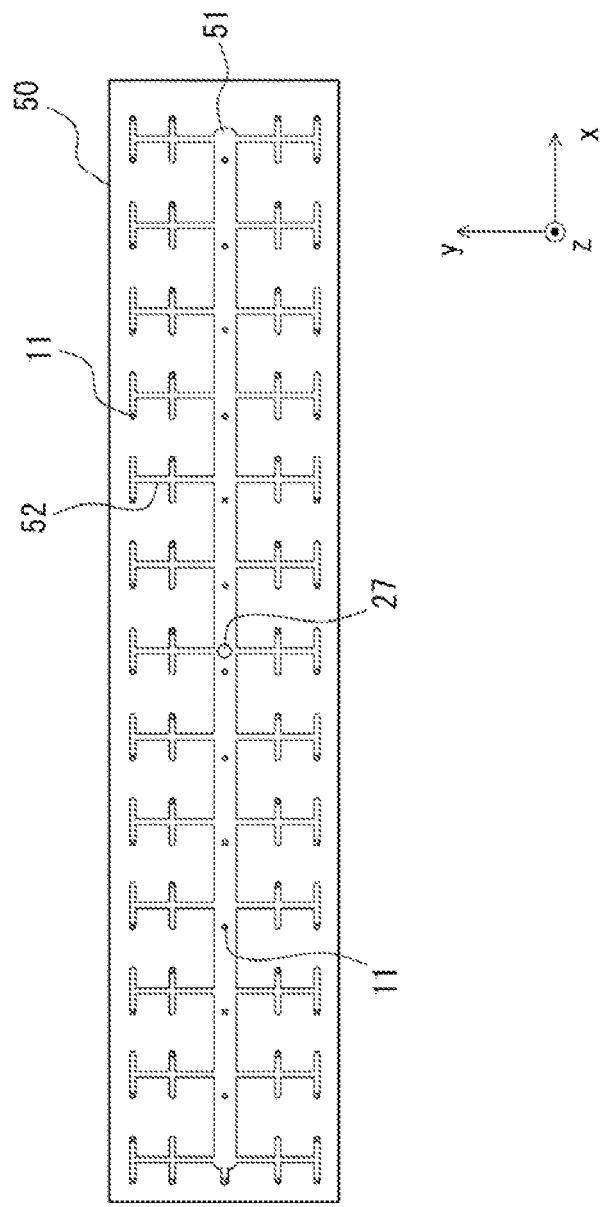
FIG. 5 is a diagram (a top view of the lower plate) for explaining another example of the configuration of the flotation conveyance apparatus according to the first embodiment.

Next, another example of the configuration of the flotation conveyance apparatus according to this embodiment will be described. FIG. 5 is a diagram (a top view of the lower plate) for explaining another example of the configuration of the flotation conveyance apparatus according to this embodiment. FIG. 5 shows flow-paths 51 and 52 formed on a lower plate 50, and also shows the positions of the ejecting ports 11 formed in the upper plate (not shown).

As shown in FIG. 5, the upstream flow-path 51 and the downstream flow-paths 52 are formed on the surface of the lower plate 50. The upstream flow-path 51 is formed so as to extend in the x-axis direction and supplies the gas supplied from the gas supply ports 27 in the x-axis direction of the lower plate 50. In the example shown in FIG. 5, the upstream flow-path 51 is in the shape of I, and the gas supply ports 27 are provided at positions where the upstream flow-path 51 becomes point-symmetrical with respect to the gas supply ports 27.

The downstream flow-paths 52 supply the gas supplied from the gas supply ports 27 through the upstream flow-path 51 to the plurality of ejecting ports 11. The end parts of the downstream flow-paths 52 on the upstream side are connected to the upstream flow-path 51. The downstream flow-paths 52 on the downstream side are branched, and end parts of the branched flow-paths are connected to the ejecting ports 11, respectively. Specifically, each downstream flow-path 52 includes a flow-path (trunk) extending in the y-axis direction from a connection point with the upstream flow-path 51, and a plurality of flow-paths (branches) extending in the x-axis direction from the flow-path (trunk). In the example shown in FIG. 5, a part of the end part (an end part of the branch) of each downstream flow-path 52 on the downstream side is connected to the ejecting port 11. A part of the ejecting port 11 is connected to the upstream flow-path 51.

In the example shown in FIG. 5, the upstream flow-path 51 are provided so as to extend in the x-axis direction, and each of the end parts of the plurality of downstream flow-paths 52 on the upstream side is connected to the upstream flow-path 51 in such a way that the end parts of the plurality of downstream flow-paths 52 on the upstream side are substantially equally spaced from each other. Specifically, the plurality of downstream flow-paths 52 are provided on the positive side of the y-axis direction of the upstream flow-paths 51, and the end parts of the downstream flow-paths 52 on the upstream side are connected to the upstream flow-path 51 in such a way that the end parts of the downstream flow-paths 52 on the upstream side are substantially equally spaced from each other. Likewise, the plurality of downstream flow-paths 52 are provided on the negative side of the y-axis direction of the upstream flow-path 51, and the end parts of the downstream flow-paths 52 on the upstream side are connected to the upstream flow-path 51 in such a way that the end parts of the downstream flow-paths 52 on the upstream side are substantially equally spaced from each other.

In the example shown in FIG. 5, the cross-sectional area of the upstream flow-path 51 is configured to be larger than that of the downstream flow-path 52. Since the resistance of the flow-path from the gas supply ports 27 to the ejecting ports 11 can be reduced, the pressure loss of the gas in the upstream flow-path 51 and the downstream flow-paths 52 can be reduced, and the gas maintained at a pressure about the same as the pressure of the gas supplied to the gas supply ports 27 can be supplied to the ejecting ports 11. It is therefore possible to effectively prevent the variations in the flow rate of the gas ejected from the respective ejecting ports 11, thereby enhancing the flotation accuracy of the substrate 30.

According to the embodiment described above, it is possible to provide the flotation conveyance apparatus which can improve the flotation accuracy of the substrate.

Second Embodiment

Next, a second embodiment will be described.

In the second embodiment, another example of the configuration of the flotation conveyance apparatus 1 near the ejecting ports described in the first embodiment will be described. Note that the configuration of the flotation conveyance apparatus 1 other than the vicinity of the ejecting ports of the flotation conveyance apparatus according to the second embodiment is the same as the configuration of the flotation conveyance apparatus 1 described in the first embodiment. Thus, repeated description is omitted.

Figure 6:
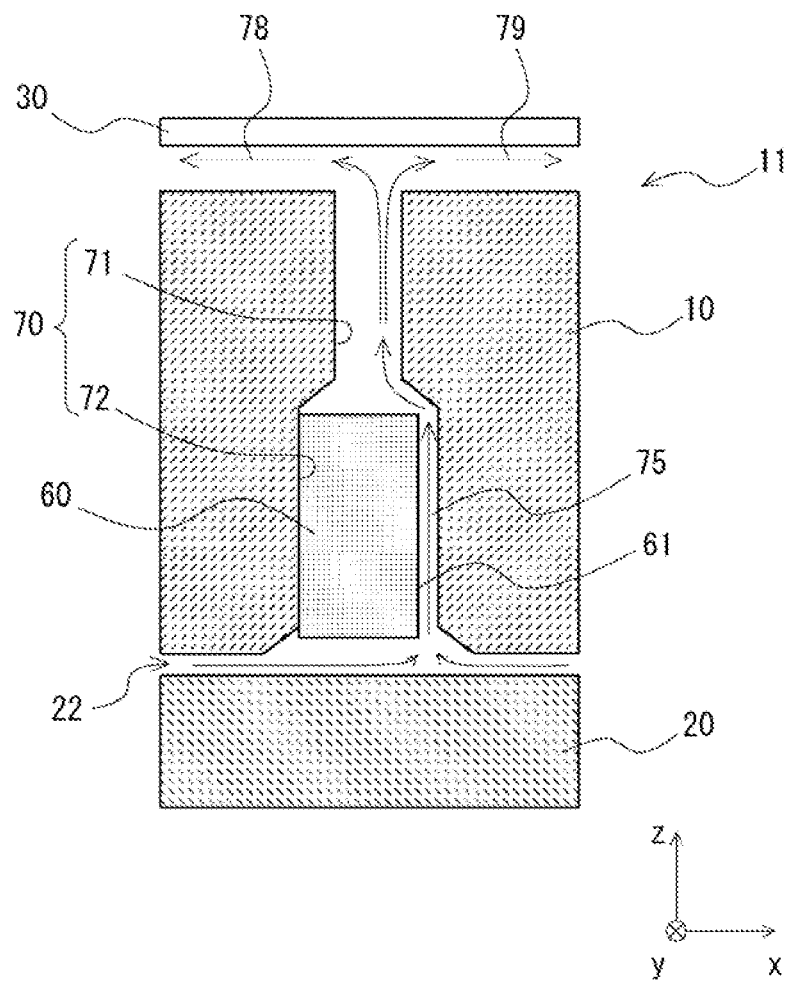
FIG. 6 is a cross-sectional view of the vicinity of a ejecting port of a flotation conveyance apparatus according to a second embodiment.
Figure 7:
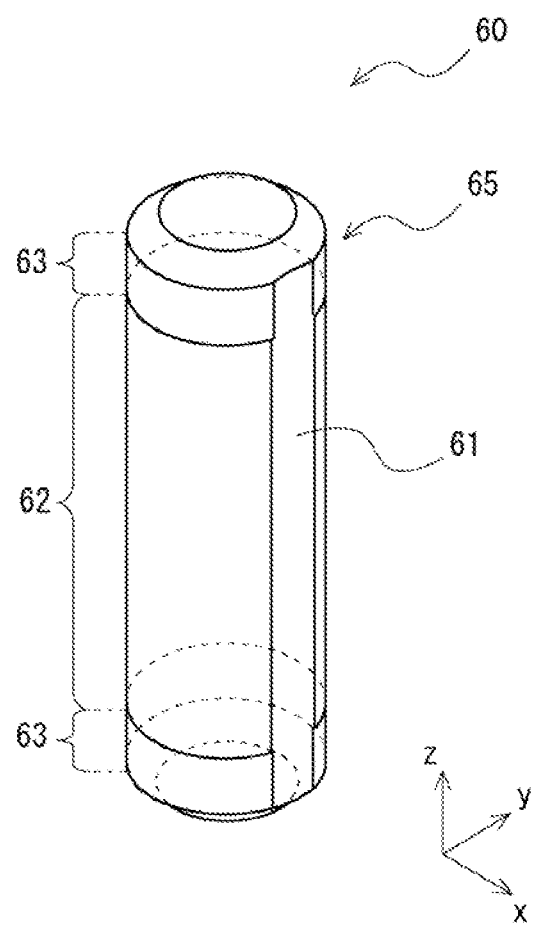
FIG. 7 is a perspective view for explaining a columnar member.

FIG. 6 is a cross-sectional view of the vicinity of the ejecting port of the flotation conveyance apparatus according to this embodiment. As shown in FIG. 6, a hole part 70 is formed in the upper surface of the flotation conveyance apparatus, i.e., in the upper plate 10 of the flotation conveyance apparatus. The hole part 70 is provided with a columnar member 60. As shown in FIG. 7, the columnar member 60 has a cutout part 61 whose side surface is cut out in a vertical direction (a z-axis direction). In this manner, the ejecting port 11 can be formed by providing the columnar member 60 having the cutout part 61 in the hole part 70.

Specifically, as shown in FIG. 6, a first hole part 71 and a second hole part 72 are formed in the upper plate 10 of the flotation conveyance apparatus, as the hole part 70. The first hole part 71 is formed on the upper surface side (the upper plate 10) of the flotation conveyance apparatus (a positive side of the z-axis direction). The second hole part 72 is formed closer to the inner side (a negative side of the z-axis direction) of the flotation conveyance apparatus (the upper plate 10) than the first hole part 71. In the configuration example shown in FIG. 6, the diameter of the first hole part 71 is smaller than the diameter of the second hole part 72, and the columnar member 60 is provided in the second hole part 72. The columnar member 60 is provided in the second hole part 72 by insertion or press-fitting.

With such a configuration, a gap 75 is formed between a side surface of the second hole part 72 and the cutout part 61 of the columnar member 60.

The gas supplied from the downstream flow-paths 22 passes through the gap 75, flows to the first hole part 71, and is ejected from the upper surface (the upper plate 10) of the flotation conveyance apparatus. The substrate 30 is floated by the ejected gas colliding with the lower surface of the substrate 30. In this embodiment, as described above, the ejecting port 11 can be easily formed, because the ejecting port 11 is formed by providing the columnar member 60 in the second hole part 72.

In the configuration example shown in FIG. 6, the diameter of the first hole part 71 is configured to be smaller than the diameter of the second hole part 72. With such a configuration, it is possible to effectively prevent the columnar member 60 from coming outside (the positive side in z-axis direction). Note that, in this embodiment, when the columnar member 60 is press-fitted into the second hole part 72 with a force sufficient to prevent the columnar member 60 from coming out, the diameter of the first hole part 71 may be the same as the diameter of the second hole part 72 (i.e., the first hole part 71 and the second hole part 72 may be formed as one hole part).

In this embodiment, the cross-sectional area of the gap 75 between the side surface of the second hole part 72 and the cutout part 61 of the columnar member 60 is made smaller than the cross-sectional area of the downstream flow-path 22. With such a configuration, a difference between the pressure of the gas before passing through the columnar member 60 and that of the gas after passing through the columner member 60 can be generated.

That is, since the cross-sectional area of the gap 75 of the columnar member 60 is smaller than the cross-sectional area of the downstream flow-path 22, the pressure of the gas in the downstream flow-path 22 is higher than the pressure of the gas in the gap 75 of the columner member 60 on an exit side. Therefore, the pressure can be made uniform throughout the upstream flow-path 21 and the downstream flow-paths 22. In other words, since the cross-sectional area of the gap 75 of the columnar member 60 is smaller than the cross-sectional area of the downstream flow-path 22, the gas is throttled when passing through the gap 75 of the columnar member 60. Thus, after the gas is made to uniformly spread to the upstream flow-path 21 and the downstream flow-paths 22, the gas can be made to pass through the gap 75. It is therefore possible to effectively prevent the pressure in the upstream flow-path 21 and the downstream flow-paths 22 from becoming uneven. For this reason, it is possible to effectively prevent the variations in the flow rate of the gas ejected from the respective ejecting ports 11.

In this embodiment, the shape of the cutout part 61 formed in the side surface of the columnar member 60 is simple. Specifically, in this embodiment, the cutout part 61 is formed by cutting out the side surface of the columnar member 60 in the vertical direction (the z-axis direction). By doing so, the gas ejected from the gap 75 of the columnar member 60 can be stabilized, and thus the substrate 30 can be stably floated.

To be more specific, gases 78 and 79 (see FIG. 6) flowing through a minute space between the substrate 30 and the flotation conveyance apparatus 1 are explained by a phenomenon based on the gas bearing theory. The gases 78 and 79 flowing through the minute space flow in a laminar flow state. For example, when the shape of the cutout part formed in the columnar member 60 is a complicated shape such as a spiral shape, the gas ejected from the ejecting ports 11 becomes a turbulent flow with vortexes. When such a turbulent flow comes into contact with the substrate 30, the flotation behavior of the substrate 30 may be disturbed and the flotation amount of the substrate 30 may vary.

On the other hand, in this embodiment, the cutout part 61 is formed by cutting out the side surface of the columnar member 60 in the vertical direction (the z-axis direction). As described above, in this embodiment, since the shape of the cutout part 61 formed in the side surface of the columnar member 60 is simple, it is possible to prevent the gas ejected from the gap 75 of the columnar member 60 from becoming a turbulent flow. Thus, the substrate 30 can be stably floated. In this case, the gases 78 and 79 flowing through the minute space between the substrate 30 and the flotation conveyance apparatus 1 can be in the laminar flow state.

Further, in this embodiment, since it is not necessary to form a complicated shape in the columnar member 60, the processing of the columnar member 60 becomes easy. That is, by simple processing of the columnar member 60, a sufficient resistance of the flow-paths can be provided to the gas passing through the gap 75.

Further, for example, when the ejecting port 11 is formed without providing the columnar member 60 in the second hole part 72, it is necessary to process the ejecting port 11 so that the diameter of the ejecting port 11 becomes extremely small. However, in such a process, it is difficult to process the ejecting port deeply in the depth direction. On the other hand, as in this embodiment, when the ejecting port 11 is formed by providing the columnar member 60 in the hole part 70 (the second hole part 72), drilling an extremely small hole becomes unnecessary, and therefore the ejecting port 11 having a narrow flow-path can be easily formed.

FIGS. 6 and 7 show an example in which the cross-sectional shape of the second hole part 72 in the xy plane is circular, and the columnar member 60 is cylindrical (i.e., the cross-sectional shape in the xy plane is circular). However, in this embodiment, the cross-sectional shape of the second hole part 72 in the xy plane may be a shape other than circular. The cross-sectional shape of the columnar member 60 in the xy plane may also be a shape other than circular. For example, the cross-sectional shape of the second hole part 72 in the xy plane may be a polygonal shape, and in this case, the cross-sectional shape of the columnar member 60 in the xy plane may also be a polygonal shape. For example, the cross-sectional shape of the second hole part 72 in the xy plane may be a square, and in this case, the columnar member 60 may be a square column (the cross-sectional shape in the xy plane is square). Even when the shape of the columnar member 60 is not cylindrical, a cutout part that is cut out in the vertical direction (the z-axis direction) is formed in the side surface of the columnar member 60.

In this embodiment, like the columnar member 60 shown in FIG. 7, the columnar member 60 may be provided with a release structure 65 in which a periphery of the columnar member on the distal end side is cut out. For example, the columnar member 60 shown in FIG. 7 is cylindrical and includes a first region 62 located at the center in the z-axis direction and second regions 63 located on the end part side. The release structure 65 can be formed by making the diameter of the circle in the cross section (in the xy plane) of the second region 63 smaller than the diameter of the circle in the cross section (in the xy plane) of the first region 62 (by cutting off the columnar member 60).

When the release structure 65 is formed as described above, if the columnar member 60 is inserted (or press-fitted. In the following descriptions, the term "insert" may be replaced by "press-fit") into the second hole part 72, the inclination of the columnar member 60 with respect to the second hole part 72 can be effectively prevented. Thus, the columnar member 60 can be inserted into an appropriate position of the second hole part 72.

Figure 8:
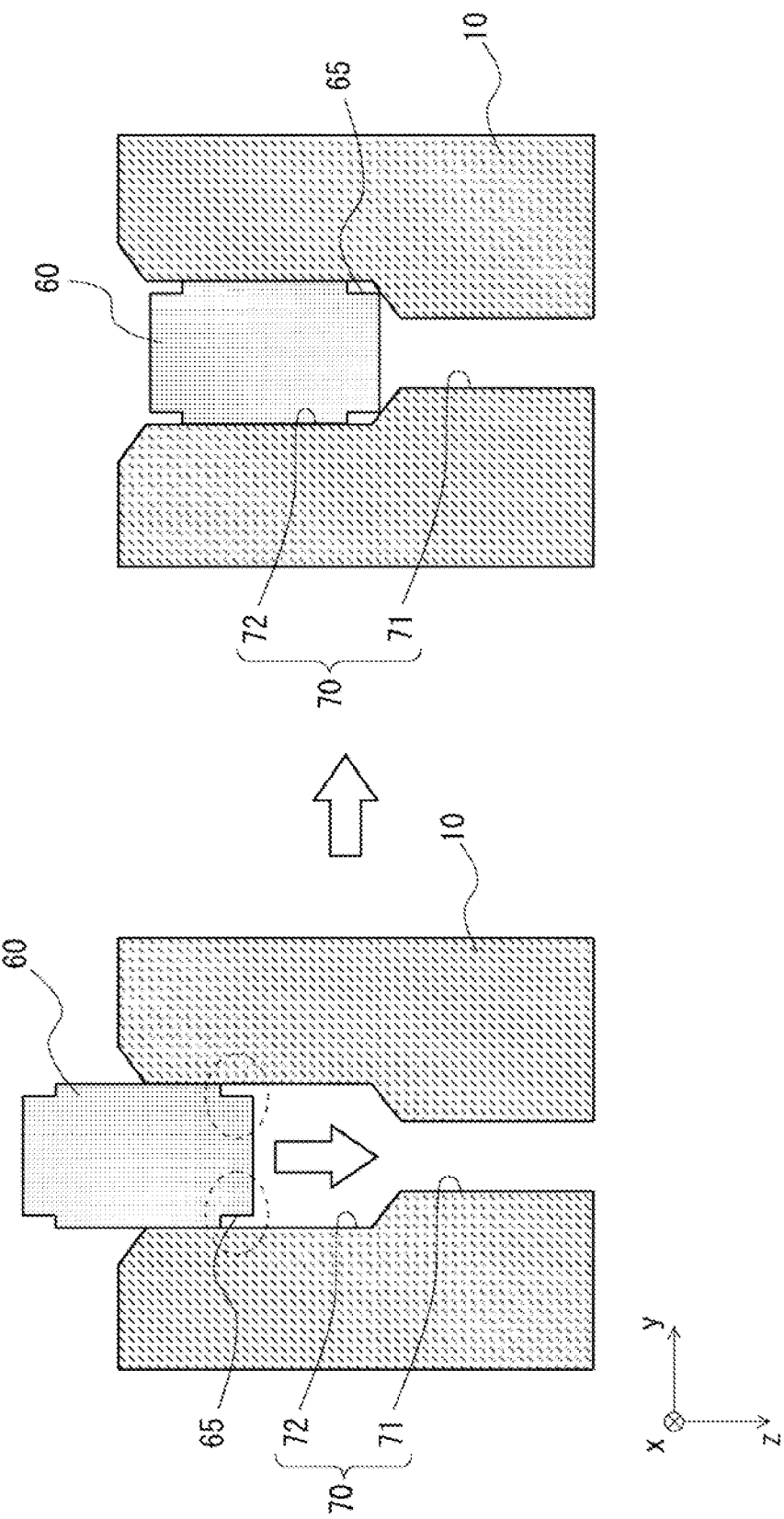
FIG. 8 is a cross-sectional view for explaining an operation of inserting the columnar member into a hole part.

FIG. 8 is a cross-sectional view for explaining the operation of inserting the columnar member into the hole part. That is, as shown in the left view of FIG. 8, when the columnar member 60 is inserted into the second hole part 72, the columnar member 60 is inserted from the negative side of the z-axis direction of the second hole part 72. In FIG. 8, the up-down direction of the upper plate 10 is reversed as compared with FIG. 6. Then, by pushing the columnar member 60 toward the positive side of the z-axis direction, as shown in the right view of FIG. 8, the columnar member 60 is inserted (press-fitted) into the second hole part 72. At this time, by providing the release structure 60 on the distal end side of the columnar member 65, when the columnar member 60 is inserted into the second hole part 72, the inclination of the columnar member 60 with respect to the second hole part 72 can be effectively prevented. Therefore, as shown in FIG. 8, the columnar member 60 can be inserted at the appropriate position of the second hole part 72.

Figure 9:
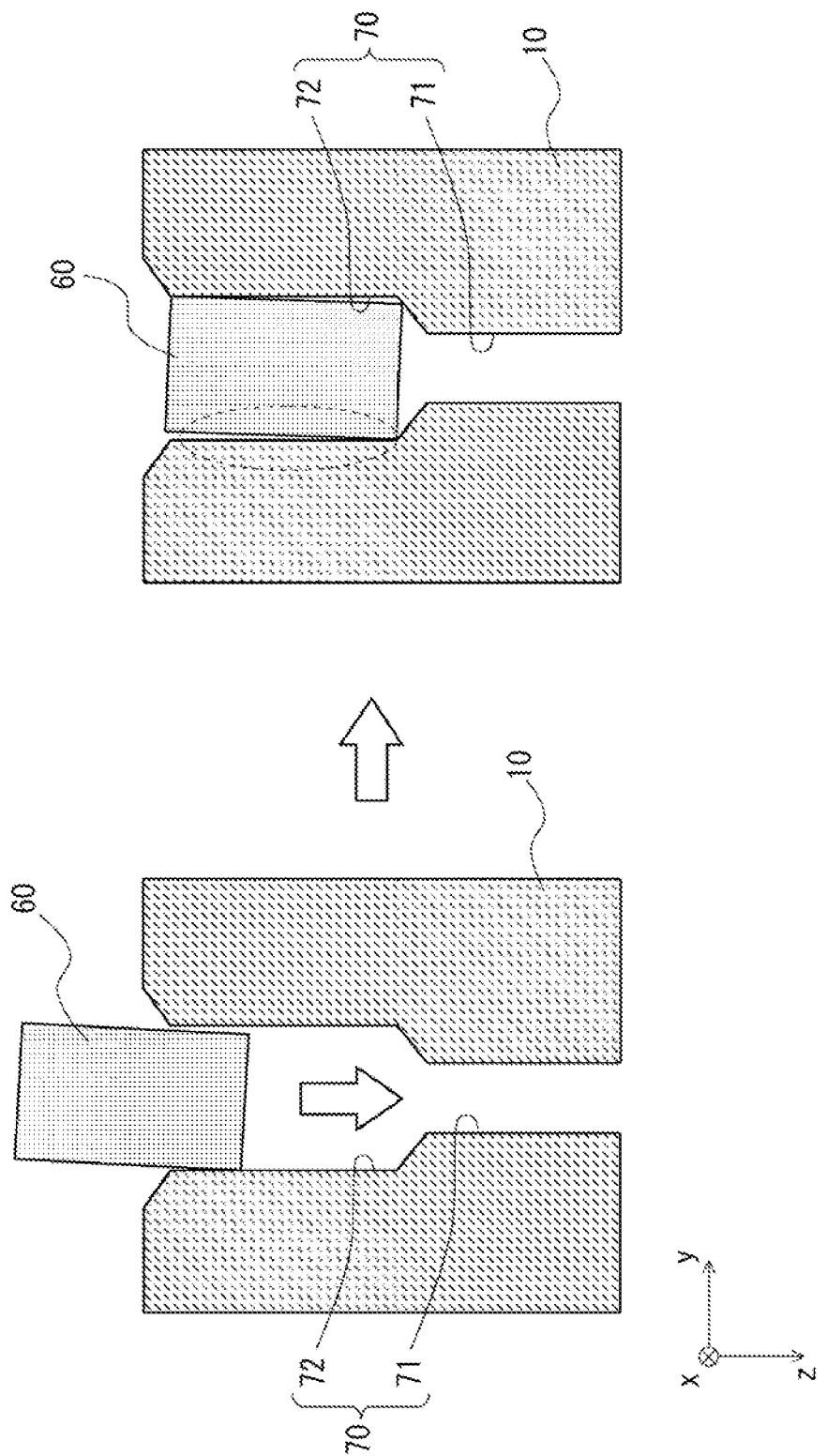
FIG. 9 is a cross-sectional view for explaining the operation of inserting the columnar member into the hole part.

For example, as shown in FIG. 9, when the release structure 65 is provided in the columnar member 60, the columnar member 60 may be inclined with respect to the second hole part 72. That is, as shown in the left view of FIG. 9, when the columnar member 60 is pushed into the second hole part 72 in a state in which the columnar member 60 is inclined with respect to the second hole part 72, the columnar member 60 is inserted (press-fitted) into the second hole part 72 while the columnar member 60 is maintained to be inclined. As described above, when the columnar member 60 is inserted into the second hole part 72 while it is inclined, the second hole part 72 may be damaged or the flow-path (see the gap 75 in FIG. 6) may be blocked.

On the other hand, when the release structure 65 is provided on the distal end side of the columnar member 60, if the columnar member 60 is inserted into the second hole part 72, the inclination of the columnar member 60 with respect to the second hole part 72 can be effectively prevented (see FIG. 8). Therefore, the columnar member 60 can be inserted into the appropriate position of the second hole part 72.

As shown in FIG. 7, the release structure 65 may be provided in two second regions 63 (both upper and lower end sides) of the columnar member 60 (specifically, the second regions 63 correspond to the release structure 65), or may be formed in only one of the two second regions 63. When the release structure 65 is formed only in one of the second regions 63 of the columnar member 60, the release structure 65 is formed in one of the two second regions 63 that becomes a distal end side (the positive side of the z-axis direction) when the columnar member 60 is inserted into the second hole part 72.

Third Embodiment

Figure 10:
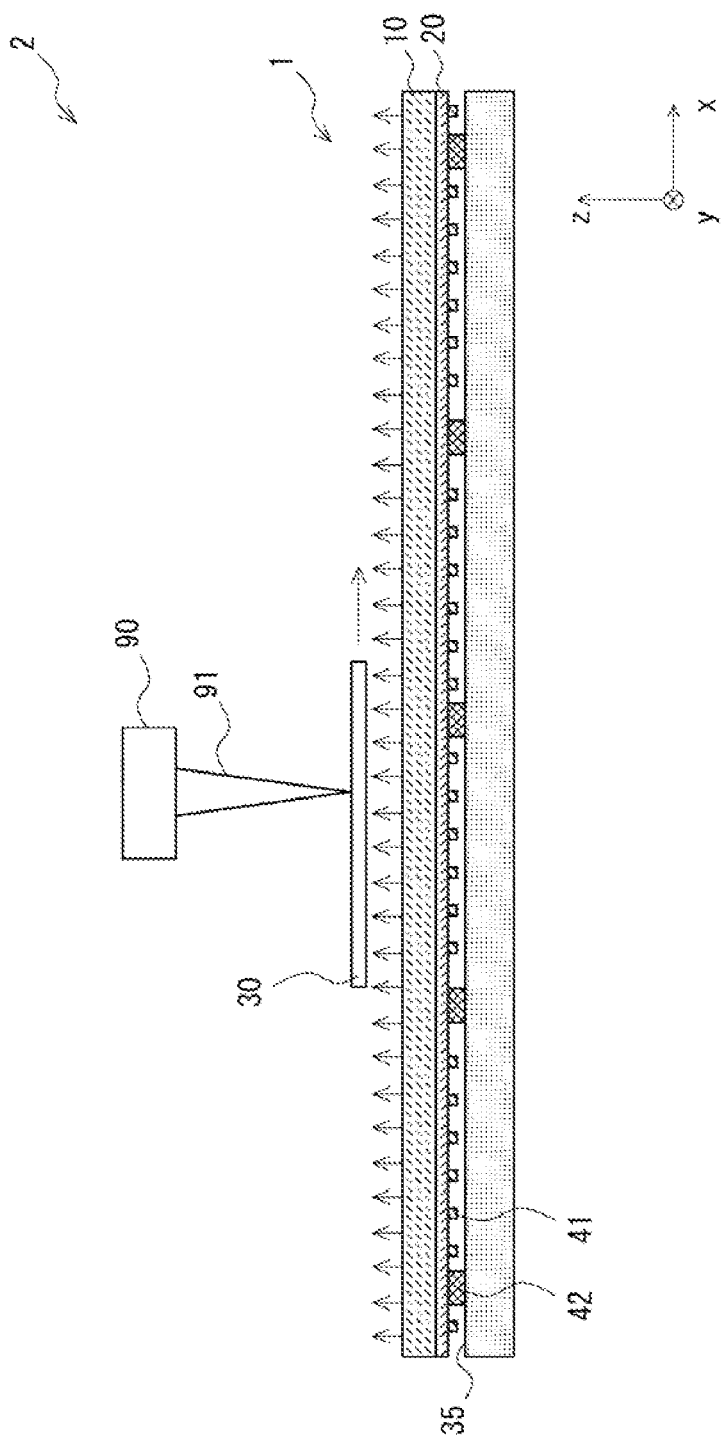
FIG. 10 is a cross-sectional view of a laser processing apparatus according to a third embodiment.

Next, a third embodiment will be described. In the third embodiment, a case in which the flotation conveyance apparatus 1 described in the first and second embodiments is used in a laser processing apparatus will be described. FIG. 10 is a cross-sectional view of a laser processing apparatus 2 according to the third embodiment. As shown in FIG. 10, the laser processing apparatus 2 includes the flotation conveyance apparatus 1 and a laser generation unit 90.

The flotation conveyance apparatus 1 conveys a substrate 30 in a conveyance direction (a positive side of an x-axis direction) while floating the substrate 30 by ejecting a gas to a lower surface of the substrate 30. Since the flotation conveyance apparatus 1 is the same as the flotation conveyance apparatus described above, the repeated description is omitted.

The laser generation unit 90 generates a laser beam 91 to be applied to a substrate 30. For example, the laser processing apparatus 2 is a laser annealing apparatus, and in this case, an excimer laser or the like may be used for the laser generation unit 90. The laser beam supplied from the laser generation unit 90 is formed into a line shape (a line shape extending in the y-axis direction) in an optical system (not shown). Thus, the laser beam 91 in the line shape, to be more specific, the laser beam 91 whose focus extending in the y-axis direction, is applied to the upper surface of the substrate 30. For example, an amorphous film is formed on the substrate 30, and the amorphous film can be crystallized by irradiating the amorphous film with the laser beam 91 and annealing it.

As described above, in the flotation conveyance apparatus 1, it is possible to effectively prevent variations in the flow rate of the gas ejected from the plurality of ejecting ports 11. It is therefore possible to accurately float the substrate 30. Thus, by using the flotation conveyance apparatus 1 in the laser processing apparatus 2, the irradiation accuracy at the time of laser irradiation can be enhanced. Specifically, it is possible to prevent the laser beam from deviating from the Depth of Focus (DOF) of the laser beam applied to the substrate 30 at the time of laser irradiation.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A flotation conveyance apparatus for conveying a substrate while floating the substrate by ejecting a gas to a lower surface of the substrate, the flotation conveyance apparatus comprising:
    a plurality of ejecting ports configured to eject the gas to the substrate;
    a first flow-path configured to supply the gas to the plurality of ejecting ports;
    a second flow-path configured to supply the gas to the first flow-path; and
    a gas supply port configured to supply the gas to the second flow-path, wherein
    a first end part of the first flow-path on an upstream side is connected to the second flow-path,
    the first flow-path on a downstream side is branched, and second end parts that are end parts of the branched flow-paths are connected to the plurality of ejecting ports, respectively, and
    a cross-sectional area of the second flow-path is configured to be larger than a cross-sectional area of the first flow-path.

2. The flotation conveyance apparatus according to claim 1, wherein
    the cross-sectional area of the second flow-path is larger than a cross-sectional area of the gas supply port.

3. The flotation conveyance apparatus according to claim 1, wherein
    the cross-sectional area of the first flow-path is substantially the same as a cross-sectional area of each of the plurality of ejecting ports.

4. The flotation conveyance apparatus according to claim 1, wherein
    the second flow-path is provided so as to extend in a predetermined direction parallel to an upper surface of the flotation conveyance apparatus, and
    first end parts of a plurality of the first flow-paths are connected to the second flow-path in such a way that the first end parts of the plurality of first flow-paths are substantially equally spaced from each other.

5. The flotation conveyance apparatus according to claim 4, wherein
    the gas supply port is provided at a position where the second flow-path becomes point-symmetrical with respect to the gas supply port.

6. The flotation conveyance apparatus according to claim 1, wherein
    a hole part is formed in an upper surface of the flotation conveyance apparatus, and
    the plurality of ejecting ports are formed by providing a columnar member including a cutout part in the hole part, and a side surface of the cutout part is cut out in a vertical direction.

7. The flotation conveyance apparatus according to claim 6, wherein
    a gap is formed by providing the columnar member in the hole part and a cross-sectional area of the gap between a side surface of the hole part and the cutout part of the columnar member is smaller than the cross-sectional area of the first flow-path.

8. The flotation conveyance apparatus according to claim 6, wherein
the columnar member includes a release structure, and a periphery of the columnar member on a distal end side is cut out.

9. The flotation conveyance apparatus according to claim 6, wherein
the hole part includes a first hole part positioned on the upper surface side of the flotation conveyance apparatus, and a second hole part positioned closer to an inner side of the flotation conveyance apparatus than the first hole part,
a diameter of the first hole part is smaller than a diameter of the second hole part, and
the columnar member is provided in the second hole part.

10. The flotation conveyance apparatus according to claim 1, further comprising:
an upper plate disposed on the substrate side and including the plurality of ejecting ports for ejecting the gas; and
a lower plate on which the first flow-path, the second flow-path, and the gas supply port are formed.

11. The flotation conveyance apparatus according to claim 10, wherein
a thickness of the lower plate is configured to be thinner than a thickness of the upper plate.

12. A laser processing apparatus comprising:
a flotation conveyance apparatus configured to convey a substrate while floating the substrate by ejecting a gas to a lower surface of the substrate; and
a laser generation unit configured to generate a laser beam to be applied to the substrate, wherein the flotation conveyance apparatus comprises:
  a plurality of ejecting ports configured to eject the gas to the substrate;
  a first flow-path configured to supply the gas to the plurality of ejecting ports;
  a second flow-path configured to supply the gas to the first flow-path; and
  a gas supply port configured to supply the gas to the second flow-path, wherein
a first end part of the first flow-path on an upstream side is connected to the second flow-path,
the first flow-path on a downstream side is branched, and second end parts that are end parts of the branched flow-paths are connected to the plurality of ejecting ports, respectively, and
a cross-sectional area of the second flow-path is configured to be larger than a cross-sectional area of the first flow-path.

13. The laser processing apparatus according to claim 12, wherein
the cross-sectional area of the second flow-path is larger than a cross-sectional area of the gas supply port.

14. The laser processing apparatus according to claim 12, wherein
the cross-sectional area of the first flow-path is substantially the same as a cross-sectional area of each of the plurality of ejecting ports.

15. The laser processing apparatus according to claim 12, wherein
the second flow-path is provided so as to extend in a predetermined direction parallel to an upper surface of the flotation conveyance apparatus, and
first end parts of a plurality of the first flow-paths are connected to the second flow-path in such a way that the first end parts of the plurality of first flow-paths are substantially equally spaced from each other.

16. The laser processing apparatus according to claim 15, wherein
the gas supply port is provided at a position where the second flow-path becomes point-symmetrical with respect to the gas supply port.

17. The laser processing apparatus according to claim 12, wherein
a hole part is formed in an upper surface of the flotation conveyance apparatus, and
the plurality of ejecting ports are formed by providing a columnar member including a cutout part in the hole part, and a side surface of the cutout part is cut out in a vertical direction.

18. The laser processing apparatus according to claim 17, wherein
a gap is formed by providing the columnar member in the hole part and a cross-sectional area of the gap between a side surface of the hole part and the cutout part of the columnar member is smaller than the cross-sectional area of the first flow-path.

* * * * *